United States Patent [19]

de Sivry et al.

[11] 4,305,591
[45] Dec. 15, 1981

[54] INFLATABLE SEALS

[75] Inventors: Bruno J. M. de Sivry, Paris; Daniel Josien, Willems, both of France

[73] Assignee: Compagnie Francaise des Petroles, Societe Anonyme, Paris, France

[21] Appl. No.: 139,521

[22] Filed: Apr. 11, 1980

[30] Foreign Application Priority Data

Apr. 11, 1979 [FR] France .............................. 79 09129

[51] Int. Cl.³ .............................................. F16J 15/46
[52] U.S. Cl. ...................................... 277/34; 277/226; 277/230
[58] Field of Search .................. 277/34, 34.3, 34.6, 277/226, 228–230

[56] References Cited

U.S. PATENT DOCUMENTS

| 1,547,240 | 7/1925 | Steele | 277/34 X |
|---|---|---|---|
| 1,586,923 | 6/1926 | Townsend | 277/34 X |
| 2,643,722 | 6/1953 | Lynes et al. | 277/34.6 |
| 2,746,709 | 5/1956 | Minor | 277/34 X |
| 3,501,868 | 3/1970 | Ganzinotti | 277/34.3 X |
| 3,858,891 | 1/1975 | Trelease | 277/229 |
| 3,940,152 | 2/1976 | Fournier | 277/34 |
| 3,967,456 | 7/1976 | Stone | 277/34 X |
| 4,109,922 | 8/1978 | Martin | 277/34.3 |

FOREIGN PATENT DOCUMENTS

| 504760 | 8/1954 | Canada | 277/34.3 |
|---|---|---|---|
| 25961 | 3/1902 | Switzerland | 277/226 |
| 1229138 | 4/1971 | United Kingdom | 277/34 |

*Primary Examiner*—Robert S. Ward, Jr.
*Attorney, Agent, or Firm*—Sughrue, Mion, Zinn, Macpeak and Seas

[57] ABSTRACT

An inflatable seal comprises a flexible active part and a rigid part which together define a chamber to be pressurized to place the active part in its operative position and to be evacuated to place the active part in its inoperative position, the active part being made from a composite material comprising an elastic material in which a wide deformable mesh of fibers of low extensibility is incorporated such that the active part has anisotropic elasticity and mechanical strength sufficient to withstand the differential pressures extend thereon in its operative and inoperative positions without the need for external reinforcements.

15 Claims, 13 Drawing Figures

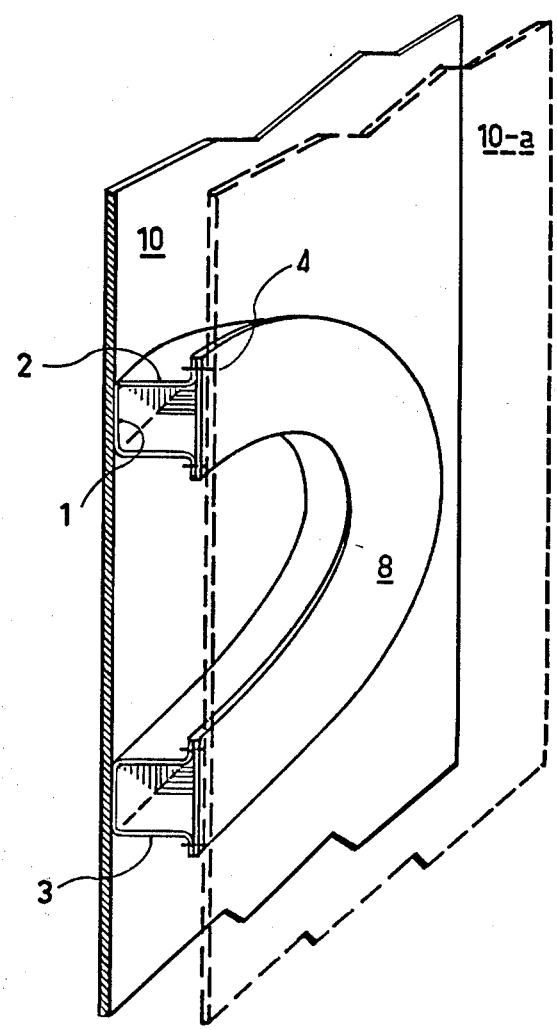

INFLATABLE SEALS

The present invention relates to an inflatable seal which is intended for application in a leaktight manner to a wall near which it is arranged.

In its most general application, a seal of this type is intended to seal a line or a surface common to two structures in contact, the seal itself thus materialising the line or the surface. A seal provided in this way must be able to withstand pressure differences up to any desired magnitude existing on either side of the line or the surface of contact, these differences being particularly substantial in the case where there is a very high vacuum on one side of the seal.

Another application of such a seal can involve gripping, in a leaktight manner, a cylindrical structure such as, for example, a tube or a bar of approximately circular cross-section. In particular, if such a structure passes through a closed chamber bounded by leaktight partitions, two such seals, each arranged so as to block the corresponding opening in the wall of the chamber, and applied against the structure, make it possible to ensure the leaktightness of the chamber. Even more particularly, it is thus possible to ensure leaktightness for a vacuum prevailing inside a welding chamber, when the chamber entirely surrounds the joint between two tubular structures which are to be joined together by welding, for example two sections of an underwater pipe for petroleum products, during laying thereof, the joining process used being electron beam welding along the approximately circular track of the join between the two tubular structures. Another application can involve sealing a chamber inside which a certain pressure, which is greater than atmospheric pressure, prevails.

One of the difficulties commonly encountered in cases of this kind lies in the fact that the structures are used direct from the boilerworks, the unavoidable surface roughnesses and unevennesses thus prohibiting the use of conventional types of seals. There is another difficulty in the above-mentioned case of pipe laying and this arises because after having welded an additional section to the free end of the pipe being laid, it is necessary to lower the immersed part of the pipe by a certain length including the additional section which has been joined thereto, in order to join a further section to the pipe. Every precaution has to be taken to avoid any risk of damaging the devices present, in particular the positioning and welding equipment, which is always sensitive and fragile. It is for this reason that the seals which are provided at the orifices of the chamber for the structure passing through the welding chamber, should be capable of creating a free space around the traversing structure, the diameter of which space should be able to reach a value which is about twice that of the diameter of the structure itself.

With the inflatable seals known at the present time, it is impossible simultaneously to obtain good leaktightness in the operative position of the seals and the provision of a large clearance in the retracted inoperative position.

According to the invention, there is provided an inflatable seal comprising an active part which, on being subjected to an inflation pressure, is placed in an operative position in which said active part is in use applied, in a leaktight manner, against a wall, and which, on being subjected to a retraction vacuum, is placed in a retracted inoperative position away from the wall, wherein said active part comprises a composite material comprising at least one elastic material with which at least one assembly of wide and deformable meshes made of fibres of low extensibility is incorporated, which assembly imparts to said active part anisotropic properties of elasticity and mechanical strength which are such that said active part possesses an elasticity enabling it to take up said retracted inoperative position and a mechanical strength enabling it to withsand differential external pressures in said operative position, and such that reinforcement outside said seal, which reinforcement would limit the space remaining free between said seal and the wall when said seal is in said retracted position, can be eliminated.

The expression "wide and deformable meshes" is understood as meaning meshes which are fairly well spaced out so that their shape can be completely changed, in particular by extending alternately in either of two perpendicular directions.

In the absence of an inflation pressure and a retraction vacuum, the rest or relaxed position assumed by said active part of said inflatable seal is preferably very close to said operative position, or at least closer to said operative position than to said retracted inoperative position. This characteristic is important for obtaining good leaktightness because said active part of said inflatable seal can then be stiffened but virtually undeformed in said operative position. In the particular case of an inflatable seal surrounding a cylindrical wall, the formation of folds in the active part of said inflatable seal when in its relaxed position can thus be avoided.

Advantageously said seal comprises a rigid part which is preferably in use parallel to the wall and is joined to said active part to close said active part in the region opposite the wall and to define therewith a hermetically sealed enclosure. A certain pressure which is greater than atmospheric pressure, or a certain vacuum or subatmospheric pressure, is created in said enclosure and it is also possible to bring the interior of said enclosure into direct communication with the atmosphere. The first case represents said operative position of said seal, the second case represents said retracted inoperative position and the third case represents said rest position of said seal.

Said active part of the seal is made of a material which is both flexible and strong, for example an elastomeric rubber, which makes it possible to ensure the leaktightness of the seal in contact with a rough surface of the structure, by matching the nonuniformities of this surface, and which enables said active part of the seal to take up the desired inoperative position. Because of the shape of said seal the elasticity of the active part of the seal must be anisotropic and differential. In the case of a seal having the shape of a body of revolution, this elasticity should preferably be apparent only in the circumferential direction and should increase from the periphery towards the centre; it should be virtually zero in the radial direction. In this way said active part of said seal can best withstand the inflation pressure to which said seal is subjected in its operative position and can withstand the stresses to which said active part is subjected when a reduced pressure or vacuum is created inside said seal to bring it to its retracted inoperative position. However, since materials of the elastomeric rubber type do not possess adequate mechanical characteristics in this respect, a composite material, as described above, is used to form the active part of the seal. Said material preferably comprises a plurality of superposed layers of an elastomer, with interposed nets or fabrics made of strong fibres of low extensibility, said nets or fabrics possessing a certain geometric deformability in their constituent meshes, which makes it possible to ensure the mechanical strength of the active part of the seal under the conditions referred to above, without the fibres which form the meshes of the net having to undergo any elongation themselves.

The layers of elastomeric material may be made of natural rubber or of any other suitable material such as nitrile rubber, polychloroprene rubber, butyl rubber, chlorosulphonated polyethylene or the like. The net or fabric interposed between any two of these layers may be of the weaver's knot type, but may equally well be made of twisted and interwoven multiple fibres. These fibres may be, for example, natural fibres, synthetic fibres, steel fibres or the like. At the apices of the meshes, the fibres may be knotted or joined together by other means such as a weld. The assembly may be vulcanised in an autoclave, in moulds, at a temperature which is compatible with the good performance in use of the various constituent materials of the composite material defined in this way, under the operating conditions corresponding to the two extreme positions of the seal, namely the operative position, in which the interior of the seal may be subjected to a relative pressure, which may for example, be of the order of one bar, on that side of the wall of the seal which is in direct contact with a chamber inside which a high vacuum, for example of the order of $10^{-2}$ mm Hg, prevails, and a retracted inoperative position in which a partial vacuum, which is much lower than that prevailing in the chamber, is created inside the seal whilst the pressure prevailing outside the seal is atmospheric pressure. Particular care should be taken when joining the active part of the seal to the rigid part. Preferably, the parts are joined using threaded bolts which are locked with the aid of suitable washers and nuts. In order to prevent any ovalisation of the holes for the bolts through the wall of said active part of said seal, the net with meshes may be replaced in the zone of said holes by a stronger reinforcement which may, for example, be made of nylon, the reinforcement being joined to said net. By way of example, although the extensibility of the net may reach 140 to 150% that of the reinforcement may be virtually zero. The join between the net and the reinforcement is made during the vulcanisation of the assembly.

The holes for the bolts through the wall of said active part are preferably made by punching.

It should be noted that the two parts of the seal may be joined together by other suitable means, in particular by sticking, but the leaktightness of the join must take precedence.

By way of example, the wall of the active part of the seal may comprise the following: a central layer made of natural rubber or an elastomer and having a thickness of about 7/10 mm, two outer layers, one on each side of the central part, having a unit thickness of about 14/10 mm, two layers of net with meshes, each arranged between one of the outer layers and the central layer and having a unit thickness of about 3 to 4/10 mm, and two reinforcements, in the extension of the abovementioned nets with meshes, having approximately the same thickness as said nets. The nets with meshes may be closed to form a continuous structure by overlapping end meshes, or a closed net may be produced in a continuous manner.

Further features and advantages of the invention will become apparent from the following description of embodiments thereof, given by way of example only, with reference to the accompanying drawings.

In the drawings:

FIG. 1 is a schematic view, in perspective, of one embodiment of a seal according to the invention, in its operative position;

FIG. 1-*a* is a schematic view, in perspective, of the seal according to FIG. 1, in its retracted inoperative position;

FIG. 2 is a schematic view, in perspective, of another embodiment of a seal according to the invention;

Figure 1:
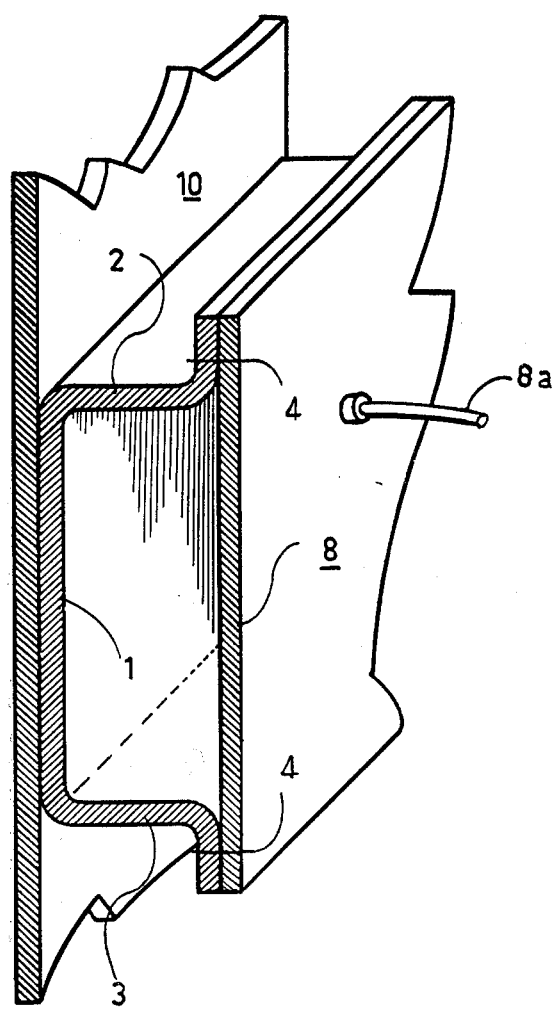
Figure 1A:
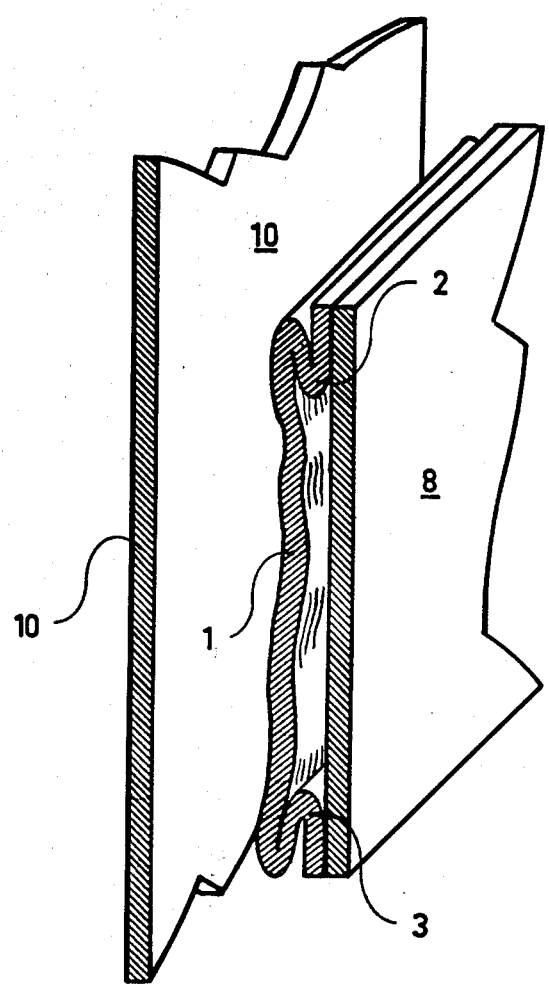

FIG. 1 shows an inflatable seal comprising a rigid part 8 and an active part comprising a central strip 1 and side cheeks or walls 2,3 by which the central strip is connected to the rigid part 8.

The inflatable seal is shown in FIG. 1 in its operative position with its active part applied, via its central strip 1, against a plane wall 10. The central strip 1, which is parallel to the plane wall 10, is extended on either side by the side-cheeks 2 and 3, which are joined to the rigid part 8 by means for example of bolts, which have been illustrated diagrammatically by their axes 4. The side cheeks may however be joined to the rigid part by any other suitable means. The active part 1, 2, 3 is made of an elastic material with incorporated deformable meshes as will be described. The active part and the rigid part of the seal together constitute a hermetically sealed enclosure which, in the case of the embodiment of FIG. 1, has a substantially rectilinear elongate general shape. In a modification, the central strip 1 may be internally reinforced by a rigid plate, optionally in the form of a flat ring, which is parallel to the wall 10 and to the rigid part 8 of the seal. The seal includes a connector 8a for pressurising or depressurising the enclosure defined thereby. For the purpose of simplification, this connector will not be shown in other figures. FIG. 1-a shows the seal of FIG. 1 but with its active part in its retracted inoperative position. In the inoperative position of the seal, the rigid part 8 of the seal remains unchanged in position relative to the wall 10 but, because of the vacuum created inside the sealed enclosure defined by the seal, the central strip is retracted to a position very close to the rigid part 8, thus clearing a wide gap between the wall 10 and the rigid part of the seal.

In the rest position of the seal, which has not been shown, the central strip 1 assumes a virtually identical position to that shown in FIG. 1, except that the strip does not exert any bearing force on the wall 10 and the contact is therefore not leaktight.

FIG. 2 shows an embodiment of a seal which is similar to that shown in FIGS. 1 and 2 except that, instead of being rectilinear, the general shape of the seal is substantially circular. The rigid part 8 of the seal is annular and is located in a plane parallel to the wall 10. In this form, the seal can for example be used to delimit a leaktight circular chamber between two parallel walls 10 and 10a, the latter wall being shown in broken lines.

An advantageous characteristic of the above desired seal is that the wall such as wall 10 against which the seal is applied can move slightly in its plane, about an initial position, whilst retaining the leaktightness properties of the seal. Movement of the wall deforms the seal, which by virtue of the flexibility and elasticity of its active part, continues to be pressed firmly against the wall 10. This behaviour of the seal is particularly marked if the shape of its central strip approximates that of a circle, as in FIG. 2, rather than that of a rectangle, as in FIGS. 1 and 1-a.

Figure 3:
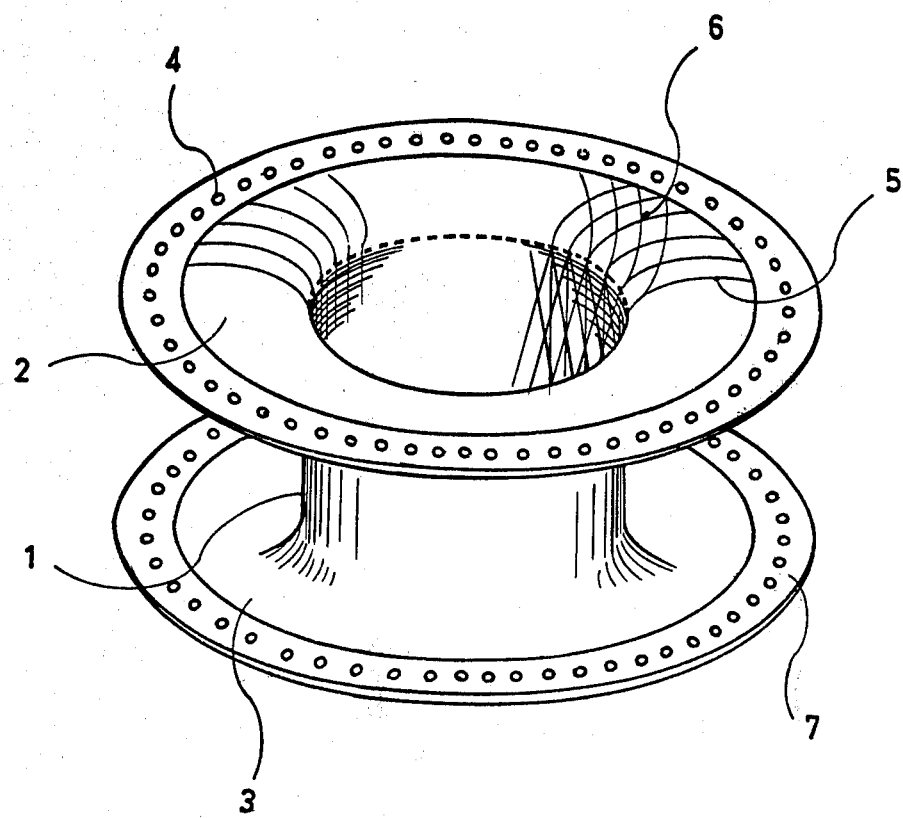
FIG. 3 is a perspective view of the active part of another embodiment of a seal according to the invention.

FIG. 3 shows the active part of a seal which is intended to be used for gripping, in a leaktight manner, a cylindrical structure such as, for example, a tube or a bar of approximately circular cross-section. The active part is approximately in the shape of a spool or reel, with a cylindrical central part 1 and two transverse cheeks 2 and 3. These cheeks may have approximately frusto-conical surfaces, for example, which are symmetrical with one another and of which the convex parts, or conversely the concave parts, are directed towards one another.

Figure 4:
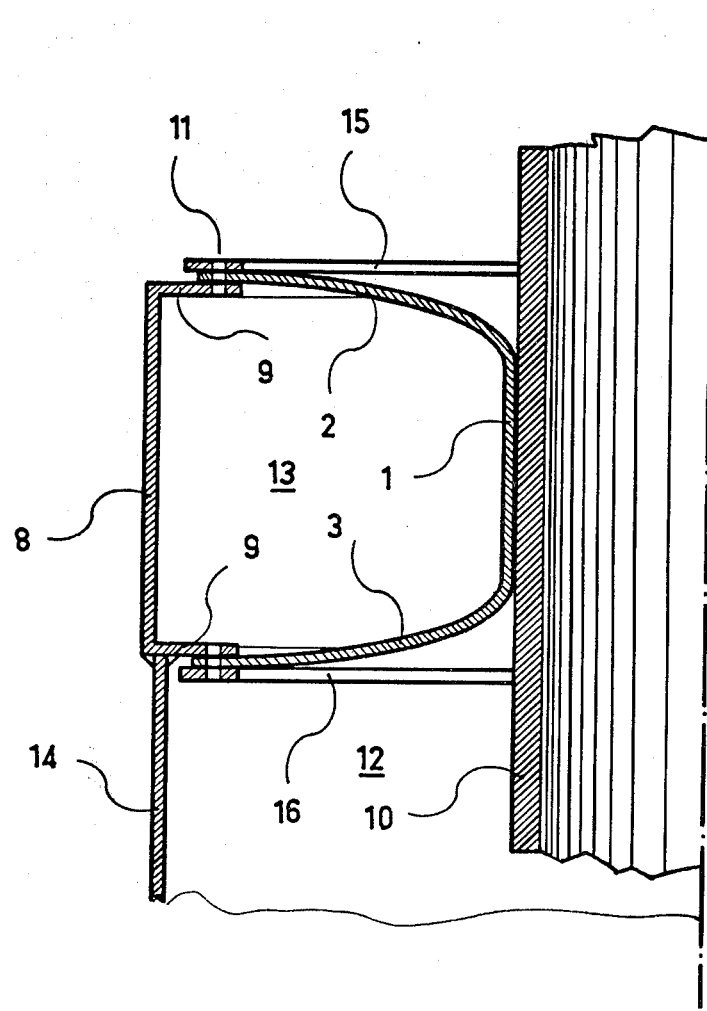
FIG. 4 is a schematic vertical half-section of the active part of the seal of FIG. 3, in its operative position.
Figure 5:
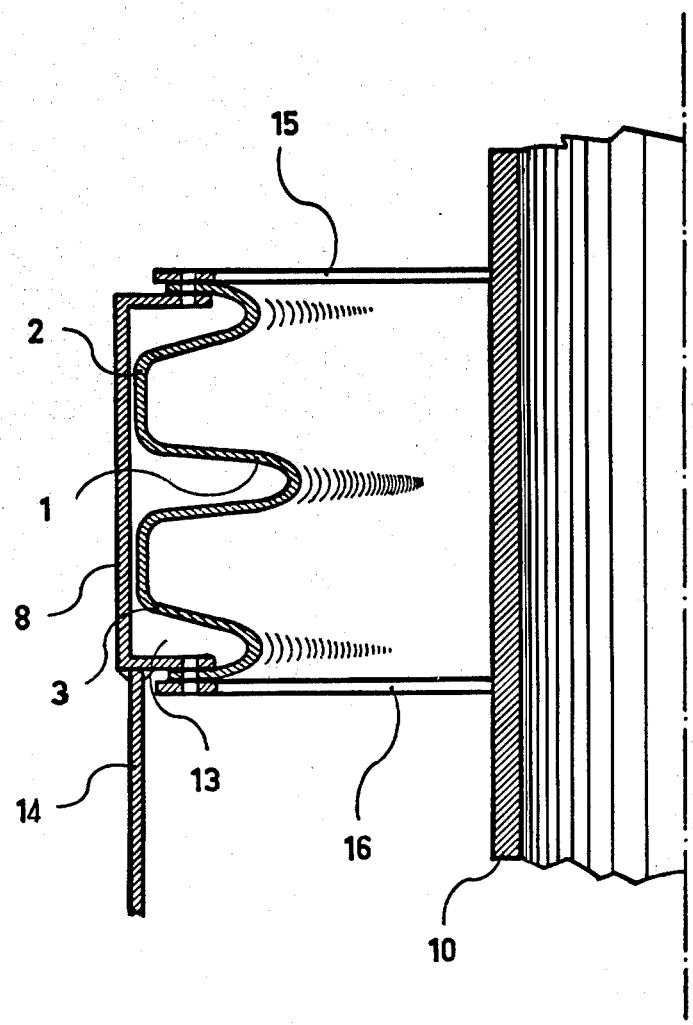
FIG. 5 is a schematic vertical half-section of the active part of the seal of FIG. 3, in its retracted inoperative position.

The rigid part 8 of the seal of FIG. 3, which is shown in FIGS. 4 and 5 to be described below, has a approximately cylindrical shape, externally envelops the active part and is joined to the latter, in a leaktight manner, by means of suitable flanges provided with holes corresponding to the holes 4 in FIG. 3, in which holes bolts for joining the active part to the rigid part of the seal are fitted, as will be explained below.

FIG. 3 also shows one of the nets which the material forming the active part comprises, the constituent fibres of the mesh being represented by 5 and the acute angle of one of the diamonds formed by these fibres being represented by 6.

On the periphery of the active part, the net with meshes is strengthened by means of a reinforcement 7, the mechanical strength of the reinforcement being greater than that of the said net. From the way in which the wall of the active part of the seal is formed, it will be seen that the elasticity of the latter is anisotropic and differential, that it is apparent only in the circumferential direction and that it increases from the perphery towards the centre of the two cheeks, the elasticity being approximately zero in the radial direction.

FIG. 4 shows a seal including the active part shown in FIG. 3, in its operative position. Thus, it shows the active part of the seal, comprising the central part 1, which in this case is cylindrical, and the two cheeks 2 and 3, the whole being continuous. The peripheries of the cheeks 2,3 are connected to edge flanges 9 of the said rigid part 8 by means of bolts (not shown) which engage in the openings 4. The annular counter-flanges 15 and 16 are provided to strengthen the upper and lower leaktight joins between the active part of the seal and the rigid part of the seal.

In its operative position the central part 1 of the seal bears firmly against the traversing structure 10 under the action of an overpressure created inside the annular space 13, defined by the seal, the overpressure being for example of the order of one bar which is equivalent to an absolute pressure of about 2 bars. The rigid part 8 of the seal may, for example, be fixed, e.g. by welding, to one end of a cylindrical wall 14 which is coaxial with the traversing structure 10, and another similar seal may be fixed to the other end of the wall 14, in an identical manner. The annular chamber 12, laterally defined between the structure 10 and the wall 14 and, above and below defined between the two seals, may form a welding chamber as referred to above inside which it is proposed to create a very high vacuum, for example of the order of $10^{-2}$ mm Hg, so that electron beam welding on the structure 10 can be carried out inside the chamber 12.

FIG. 5 shows the seal of FIG. 4 in its retracted inoperative position, in which the profile of the active part of the seal has been changed because of the creation of a partial vacuum inside the space 13, and because of the resulting action of atmospheric pressure on the active part.

It will be seen that, because of the elasticity of the wall of the said active part, the free space cleared by the seal, in its retracted inoperative position, has a radial extent which is of the same order of magnitude as that of the cylindrical structure, i.e. the free space has a radius which is about twice that of the diameter of the structure. In practice it is possible for this order of magnitude to be more than about one hundred times greater than that which is usually obtained with a conventional seal, and more than about ten times greater than that of the thickness of the seal itself, in its retracted inoperative position.

Figure 6:
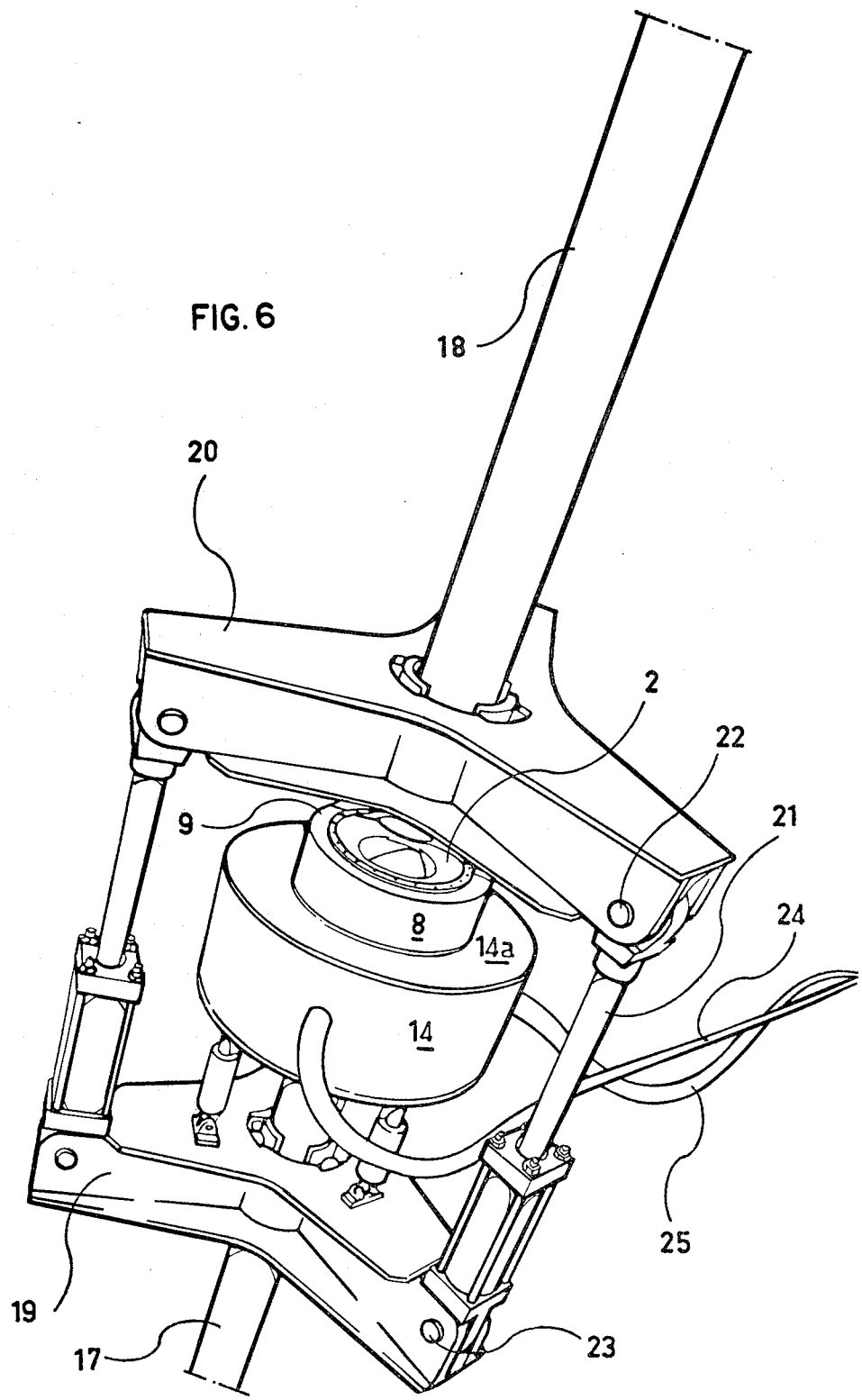
FIG. 6 is a perspective view of a piece of equipment using an embodiment of a seal according to the invention, and for joining together two tubular structures by electron beam welding.

FIG. 6 shows a complete piece of complex equipment which is intended to be used for joining two tubular sections together by welding, the sections forming, after joining, the traversing structure referred to above, and the equipment using two seals as described above. The apparatus is fixed to a lower tubular section 17, which is to be joined to an upper tubular section 18. Two endpieces 19,20, each with three arms are connected by means of three jacks 21, each pivoting about two shafts 22 and 23. The equipment includes an electron beam welding chamber having an external cylindrical wall 14 which is coaxial with the traversing structure 17, 18, and two end walls 14a which delimit the chamber at the top and bottom. One seal as described above is mounted on each of these end walls, only the upper seal being visible in FIG. 6, in particular its rigid part 8, the edge flange 9 of the rigid part and the upper cheek 2 of the active part of the seal. A high vacuum is produced inside the welding chamber 12 via tubes 24, 25. For the purpose of simplification, the analogous tubes which enable the overpressure and the vacuum to be produced, in turn, inside the annular space 13 in each of the seals have not been shown.

Figure 7:
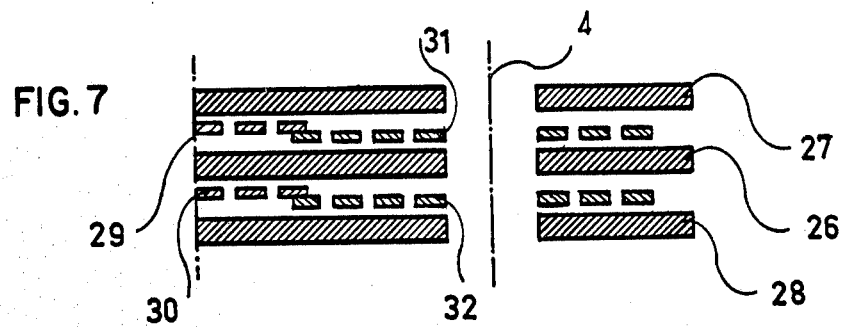
FIG. 7 is a schematic partial section through a composite material of the active part of an embodiment of a seal according to the invention, near its peripheral edge.

FIG. 7 is a view of the structure of a strong elastic fabric as described above and used for the active part of any of the above described seals. The fabric comprises a central layer 26, which is made, for example, of natural rubber or an elastomer, and two outer layers 27,28 made of an analogous material. Two nets 29, 30 with wide deformable meshes of fibres of low extensibility are intercalated between the abovementioned layers. The reinforcements 31 and 32 which are joined to the nets 29 and 30, respectively, and form the peripheral part of the cheeks of the seal, are also shown. As already explained, the holes 4 which are preferably obtained by punching, receive the threaded fixing bolts, which are not shown, the lock-nuts of the bolts being arranged on top of the counter-flanges 15.

Figure 8:
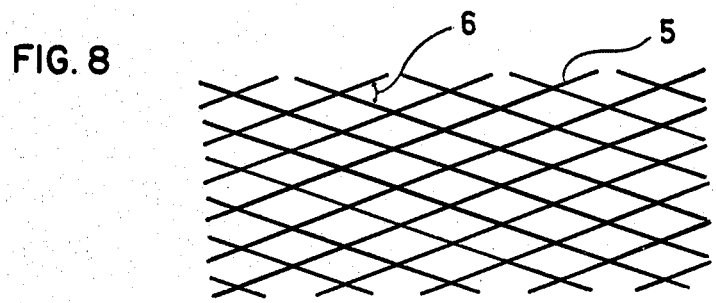
FIG. 8 is a schematic partial section, taken in a plane parallel to the surface of active part of the seal, and showing meshes of the net of the composite material of the active part of the seal in the rest position of the latter.
Figure 9:
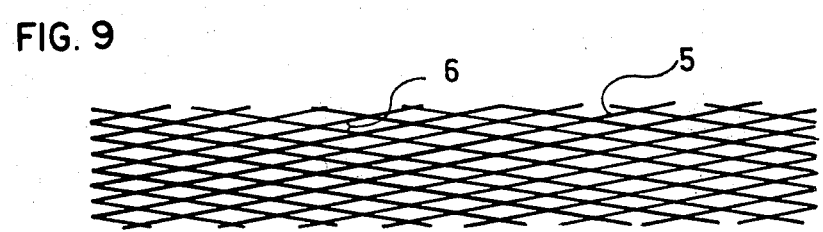
FIG. 9 is analogous to FIG. 8 and shows part of the same net but in the operative position of the active part of the seal.
Figure 10:
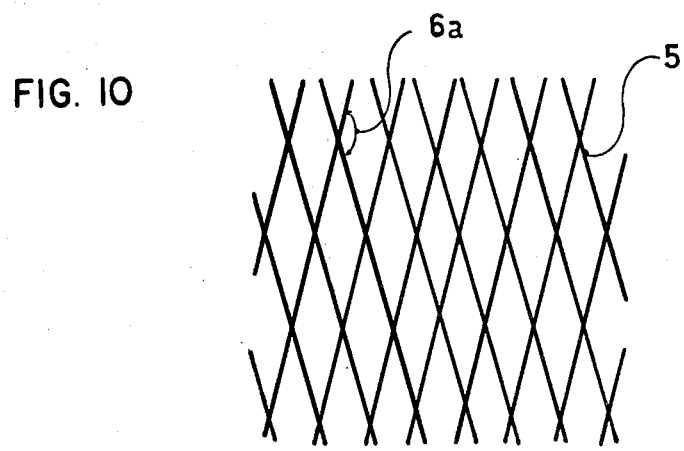
FIG. 10 is analogous to FIGS. 8 and 9 and shows part of the same net but in the retracted inoperative position of the active part of the seal.

FIGS. 8, 9 and 10 show a net with wide deformable meshes, which is part of the fabric forming the active part of the seal. The net is made of filaments 5 which intersect to define diamonds having angle 6 or 6a, the angle being acute in FIGS. 8 and 9, which correspond to the rest position and the operative position of the active part of the seal respectively, whereas the corresponding angle 6a, as shown in FIG. 10, is an obtuse angle and corresponds to the retracted inoperative position of the active part of the seal. In the operative position and in the rest position, the short diagonal of the diamond formed by each mesh is preferably orientated in the direction in which the greatest deformation of the active part occurs, when the part is in its retracted inoperative position. In the case of FIG. 3, in the cylindrical portion 1, the long diagonal of the diamond is thus parallel to the axis of the said portion.

The above described seals may be improved by interposing a plurality of axially distributed, solid auxiliary seals between the active part of the inflatable seal and the wall of the traversing structure against which the seal is to bear, the auxiliary seals being vulcanised together with the inflatable seal or being joined to the latter by any suitable known means, for example by sticking. The auxiliary seals may be of any suitable type, such as for example as O-ring seals.

Figure 11:
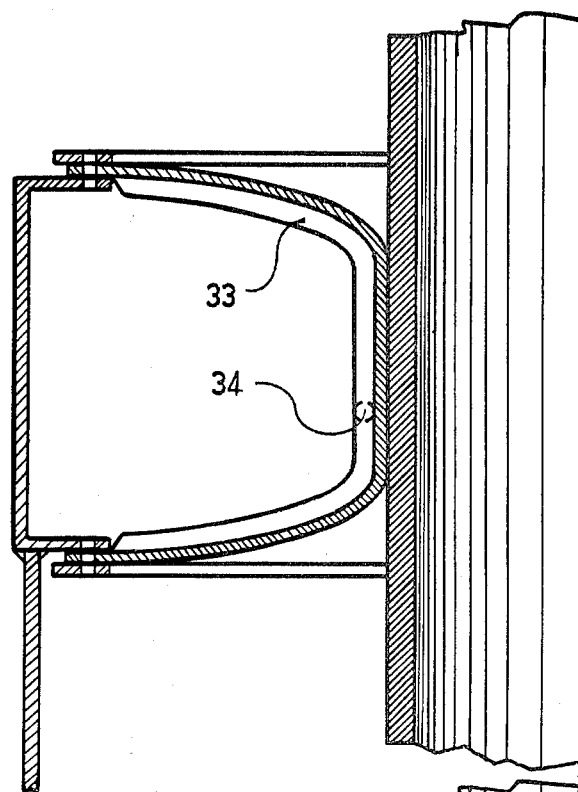
FIG. 11 is a vertical half-section through a further embodiment of the invention, in which the wall of the active part of the seal is reinforced by a plurality of inflatable tubes.
Figure 12:
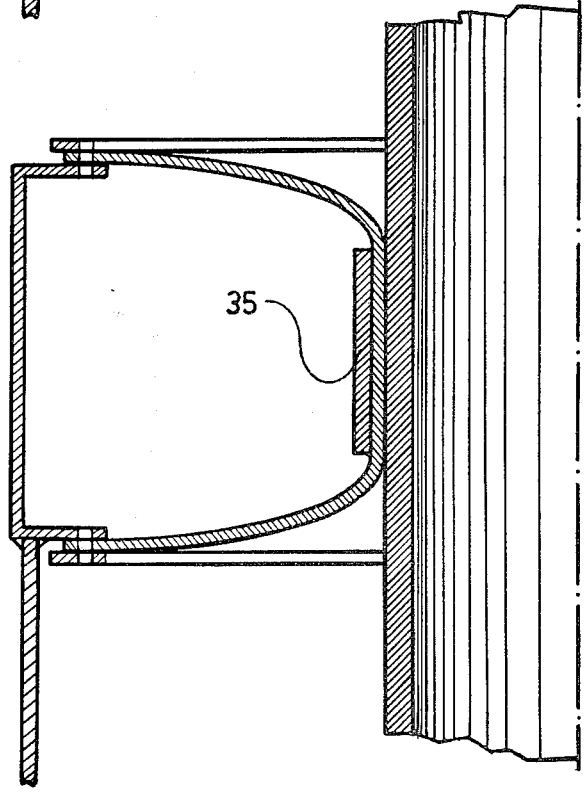
FIG. 12 is a vertical half-section through another embodiment of the invention, in which the wall of the active part of the seal is reinforced by a plurality of rigid ribs.

Finally, two other modifications may be made to the seal of FIG. 4 as shown in FIGS. 11 and 12.

In the case of FIG. 11, the only additions are inflatable tubes 33, which have a cross-section such as 34 and are intended to increase the bearing force of the wall of the active part of the seal against the wall of the traversing structure.

For the same purpose, rigid ribs, such as 35 shown in FIG. 12, can be joined at the same points.

These tubes 33 and ribs 35 can be fixed to the wall of the active part of the seal by any known means.

If it proves necessary to reduce the amplitude of retraction of the active part of the seal it is possible to interpose between the active part and the rigid part, an approximately plane element which has a suitable contour, is parallel to the rigid part and is itself rigid. The latter element may be joined to the rigid part of the seal without in any way jeopardising the effectiveness of the leaktightness provided by the seal.

Furthermore, if it is desired to be able to obtain a very rapid partial separation between the wall against which the seal in its operative positions bears and the seal, the seal may be equipped with means which make it possible to retract the seal very rapidly, for example by providing a chamber in the immediate vicinity and in which a certain vacuum prevails, and by bringing this chamber into direct communication with the seal at the desired moment.

What is claimed is:

1. An inflatable seal, comprising: an active member inflatable under pressure to an operative position in which it sealingly bears against a rigid wall, and which may be retracted by vacuum to an inoperative position away from the wall, said active member comprising a flexible composite material including at least one elastic layer within which at least one wide and deformable mesh made of fibres of low extensibility is incorporated, said mesh fibres comprising two sets of cords oriented in a net-like pattern having a plurality of intersection points, and said cord sets being firmly joined together at each intersection point, said mesh being oriented to impart to said active member anisotropic properties of elasticity and mechanical strength such that said active member possesses an elasticity enabling it to take up said retracted inoperative position and a mechanical strength enabling it to withstand differential external pressures in said operative position, and such that reinforcement outside said seal, which would limit the space remaining free between said seal and the wall when said seal is in said retracted position, can be eliminated, and a rigid member sealingly joined to said active member to close said active member in a region opposite said wall and define therewith a hermetically sealed enclosure.

2. An inflatable seal, comprising: an active member inflatable under pressure to an operative position in which it sealingly bears against a rigid wall, and which may be retracted by vacuum to an inoperative position away from the wall, said active member comprising a flexible composite material including at least one elastic layer within which at least one wide and deformable mesh made of fibres of low extensibility is incorporated, said mesh being oriented to impart to said active member anisotropic properties of elasticity and mechanical strength such that said active member possesses an elasticity enabling it to take up said retracted inoperative position and a mechanical strength enabling it to withstand differential external pressures in said operative position, and such that reinforcement outside said seal, which would limit the space remaining free between said seal and the wall when said seal is in said retracted position, can be eliminated, and a rigid member sealingly joined to said active member to close said active member in a region opposite said wall and define therewith a hermetically sealed enclosure, wherein said active member forms a seal against a cylindrical wall having a generally annular shape, said rigid member is substantially cylindrical and is provided with two flanges, and said active member has the form of a reel including a cylindrical portion and two lateral cheeks, said cheeks being joined to said flanges of said rigid member.

3. A seal according to claim 1 or 2, wherein, in the region where said active member is joined to said rigid member, said active member comprises a reinforcement having a greater mechanical strength than said mesh.

4. A seal according to claim 1 or 2, wherein, in the absence of an inflation pressure and a retraction vacuum, said active member assumes a rest position approximating said operative position.

5. A seal according to claim 1 or 2, wherein said composite material forming said active member comprises a plurality of superposed layers of an elastomer of high elasticity and nets with wide and deformable meshes made of fibres of low extensibility, said nets being interposed between said layers.

6. A seal according to claim 5, wherein said fibres of low extensibility are knotted at the apices of said meshes.

7. A seal according to claim 5, said fibres of low extensibility are welded at apices of said meshes.

8. A seal according to claim 1 or 2, wherein in said operative position of said active member, said mesh has the shape of diamonds, the short diagonals of which are orientated in the direction in which the greatest deformation of said active member occurs when said active member takes up its retracted inoperative position.

9. A seal according to claim 1, wherein said active member forms a seal against a cylindrical wall having a generally annular shape, said rigid member is substantially cylindrical and is provided with two flanges, and said active member has the form of a reel including a cylindrical portion and two lateral cheeks, said cheeks being joined to said flanges of said rigid member.

10. A seal according to claim 9, wherein said mesh is in the shape of diamonds, the long diagonals of which, in said cylindrical portion, are orientated parallel to the axis of said cylindrical portion in said operative position of said active member.

11. A seal according to claim 1, including a plurality of inflatable tubes joined to the interior of said active part.

12. A seal according to claim 1, including a plurality of rigid ribs joined to the interior of said active part.

13. A seal according to claim 1 for sealing against a plane wall, wherein said active part is reinforced by a rigid plate which extends within said seal and parallel to the wall.

14. A seal according to claim 1 or 2,
wherein, in said retracted inoperative position, the thickness of said seal is about one tenth of the space remaining free between said seal and the wall.

15. A seal according to either claim 9 or claim 10, wherein, in said retracted inoperative position, the space remaining free between said seal and the cylindrical wall has a radius approximately the same as that of the cylindrical wall.

* * * * *